United States Patent
Liu et al.

(10) Patent No.: US 11,946,135 B2
(45) Date of Patent: Apr. 2, 2024

(54) LOW TEMPERATURE DEPOSITION OF IRIDIUM CONTAINING FILMS

(71) Applicant: Applied Materials, Inc., Santa Clara, CA (US)

(72) Inventors: Feng Q. Liu, San Jose, CA (US); Hua Chung, San Jose, CA (US); Schubert Chu, San Francisco, CA (US); Mei Chang, Saratoga, CA (US); Jeffrey W. Anthis, San Jose, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/190,246

(22) Filed: Mar. 27, 2023

(65) Prior Publication Data
US 2023/0227968 A1   Jul. 20, 2023

Related U.S. Application Data

(62) Division of application No. 16/129,232, filed on Sep. 12, 2018, now Pat. No. 11,643,721.

(60) Provisional application No. 62/557,486, filed on Sep. 12, 2017.

(51) Int. Cl.
| | |
|---|---|
| *C23C 16/42* | (2006.01) |
| *C23C 16/14* | (2006.01) |
| *C23C 16/455* | (2006.01) |
| *C23C 16/507* | (2006.01) |
| *C23C 16/513* | (2006.01) |
| *C23C 16/52* | (2006.01) |

(52) U.S. Cl.
CPC .............. *C23C 16/42* (2013.01); *C23C 16/14* (2013.01); *C23C 16/45536* (2013.01); *C23C 16/45542* (2013.01); *C23C 16/507* (2013.01); *C23C 16/513* (2013.01); *C23C 16/52* (2013.01)

(58) Field of Classification Search
CPC .............. C23C 16/52; C23C 16/45536; C23C 16/45542
See application file for complete search history.

(56) References Cited

U.S. PATENT DOCUMENTS

| | | |
|---|---|---|
| 4,830,891 A | 5/1989 | Nishitani et al. |
| 5,433,975 A | 7/1995 | Roberts et al. |
| 6,344,400 B1 | 2/2002 | Yutani |

(Continued)

FOREIGN PATENT DOCUMENTS

| | | |
|---|---|---|
| JP | 61127865 A | 6/1986 |
| WO | 2006032963 A2 | 3/2006 |
| WO | 2008057749 A1 | 5/2008 |

OTHER PUBLICATIONS

PCT International Search Report and Written Opinion in PCT/US2018/050657 dated Jan. 4, 2019, 13 pages.

(Continued)

*Primary Examiner* — Joseph A Miller, Jr.
(74) *Attorney, Agent, or Firm* — Servilla Whitney LLC

(57) ABSTRACT

Processing methods for forming iridium-containing films at low temperatures are described. The methods comprise exposing a substrate to iridium hexafluoride and a reactant to form iridium metal or iridium silicide films. Methods for enhancing selectivity and tuning the silicon content of some films are also described.

14 Claims, 1 Drawing Sheet

(56) References Cited

U.S. PATENT DOCUMENTS

| | | | |
|---|---|---|---|
| 2004/0043578 A1* | 3/2004 | Marsh | H01L 28/65 |
| | | | 257/E21.171 |
| 2004/0053496 A1 | 3/2004 | Choi | |
| 2005/0202173 A1 | 9/2005 | Mills | |
| 2007/0259111 A1 | 11/2007 | Singh et al. | |
| 2010/0012923 A1 | 1/2010 | Hiura et al. | |
| 2010/0167527 A1 | 7/2010 | Wu et al. | |
| 2011/0020546 A1 | 1/2011 | Hämäläinen et al. | |
| 2013/0040056 A1 | 2/2013 | Gatineau et al. | |
| 2014/0120723 A1 | 5/2014 | Fu et al. | |
| 2016/0322229 A1 | 11/2016 | Ganguli et al. | |
| 2017/0247794 A1 | 8/2017 | Mukae et al. | |

OTHER PUBLICATIONS

"Wikipedia Tungsten hexafluoride", 5 pgs.

Dussarrat, Christian, et al., "High Purity Iridium Thin Films Deposition Using The Inorganic IrF6", ResearchGate, Jan. 2005, 1 pg.

Kalanyan, Berc, "Atomic Layer Deposition and Nucleation of Metals and Metal Oxides: Selective Area Reactions and Conformal 3D Processing", 233 pgs.

Vargas Garcia, J.R., et al., "Chemical Vapor Deposition of Iridium, Platinum, Rhodium and Palladium", Materials Transactions, vol. 44, No. 9, 2003, 1717 to 1728.

\* cited by examiner

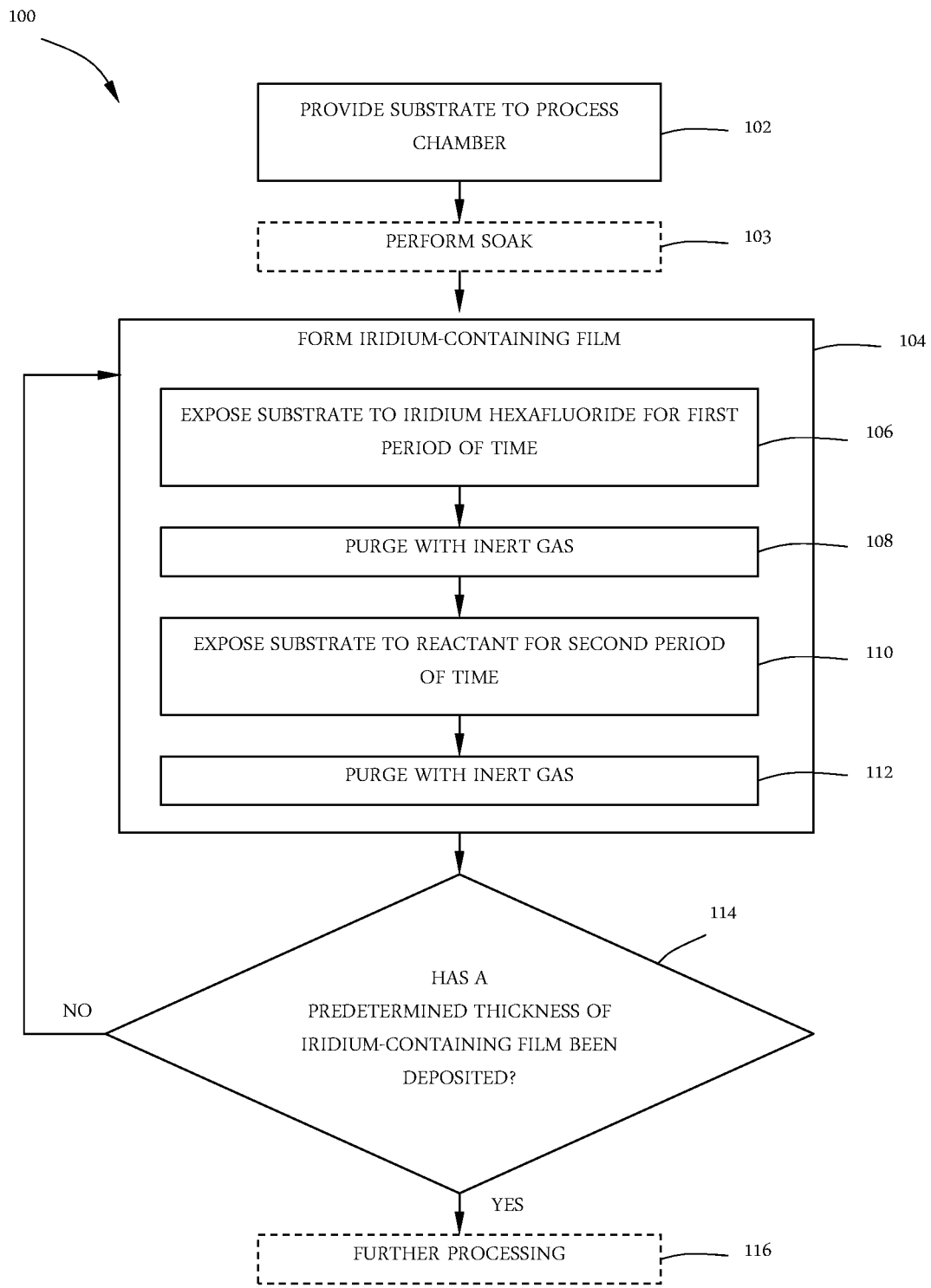

LOW TEMPERATURE DEPOSITION OF IRIDIUM CONTAINING FILMS

CROSS-REFERENCE TO RELATED APPLICATIONS

This application is a Divisional application of U.S. patent application Ser. No. 16/129,232, filed Sep. 12, 2018, which claims priority to U.S. Provisional Application No. 62/557,486, filed Sep. 12, 2017, the entire disclosures of which are hereby incorporated by reference herein.

FIELD

Embodiments of the disclosure relate to methods for depositing thin films containing iridium. More particularly, embodiments of the disclosure are directed to methods of depositing iridium containing film at low temperatures using iridium hexafluoride.

BACKGROUND

Metal silicides have important applications in semiconductor devices as contacting materials. As device features becomes smaller, metal silicides are critical to ensure the functionality of the advanced devices due to their low resistance, good process compatibility, lower electromigration and good contact with other materials during the integration process.

When metal silicides are used in a p/n contact, the p contact metal silicide is more difficult to integrate because of its work function requirement. Another important requirement of the metal silicide is its conformal deposition around the contact geometry surface. Therefore, an ALD or ALD-like process of metal silicide is needed for integration.

Iridium is a newly proposed material for integration owing to its high melting point (ability to withstand high current densities), exceptional density, and ability to conduct electrical current. Iridium and iridium containing thin films have attractive material and conductive properties. Iridium films have been proposed for applications from front end to back end parts of semiconductor and microelectronic devices.

Iridium silicide (germanide) is an important candidate for p contact material. There are not many iridium precursors suitable for metallic iridium processes or co-precursors for iridium silicide processes. In particular need are precursors for very pure iridium and related processes. These do not appear in publications or commercial products.

Thin-films of iridium and/or iridium silicide would ideally be deposited using thin-film deposition techniques such as Chemical Vapor Deposition (CVD) and Atomic Layer Deposition (ALD) owing to their inherent ability to deposit material in a high-throughput, conformal, and precise fashion.

Chemical vapor deposition (CVD) is one of the most common deposition processes employed for depositing films on a substrate. CVD is a flux-dependent deposition technique that uses precise control of the substrate temperature and the precursors introduced into the processing chamber in order to produce a desired film of uniform thickness. The reaction parameters become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the film to a desired thickness.

The advancing complexity of advanced microelectronic devices is placing stringent demands on currently used deposition techniques. Unfortunately, there are a limited number of viable chemical precursors available that have the requisite properties of robust thermal stability, high reactivity, and vapor pressure suitable for film growth to occur.

In addition, precursors that often meet these properties still suffer from poor long-term stability and lead to thin films that contain elevated concentrations of contaminants such as oxygen, nitrogen, and/or halides that are often deleterious to the target film application. Therefore, there is a need for improved deposition methods for thin films containing iridium.

SUMMARY

One or more embodiments of the disclosure are directed to a method of depositing an iridium-containing film. The method comprises exposing a substrate surface maintained at a temperature in the range of about −25° C. to less than 250° C. to iridium hexafluoride and a reactant.

Additional embodiments of the disclosure are directed to a method of selectively depositing an iridium metal film. The method comprises sequentially exposing a substrate surface maintained at a temperature in the range of about −25° C. to less than 300° C. to iridium hexafluoride and a reactant comprising hydrogen. The substrate surface comprises a first material consisting essentially of silicon and a second material comprising silicon oxide, silicon nitride or $Al_2O_3$. The iridium metal film is deposited with a selectivity greater than or equal to about 15 and contains essentially no fluorine atoms and greater than or equal to about 99.8% iridium atoms.

Further embodiments of the disclosure are directed to a method of depositing an iridium silicide film. The method comprises sequentially exposing a substrate surface maintained at a temperature in the range of about 150° C. to less than 300° C. to iridium hexafluoride and tetrasilane. One or more of a flow rate of the tetrasilane, a pulse time of the tetrasilane, or the temperature of the substrate surface are controlled to form an iridium silicide film with essentially no fluorine atoms and a predetermined silicon content.

BRIEF DESCRIPTION OF THE DRAWING

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

The FIGURE illustrates an exemplary process sequence for the formation of a iridium film using a two pulse cyclical deposition technique according to one embodiment described herein.

DETAILED DESCRIPTION

Embodiments of the disclosure provide methods for depositing iridium-containing films within a broad temperature window, including at very low temperatures (e.g. room temperature or below). The process of various embodiments use vapor deposition techniques, such as an atomic layer deposition (ALD) or chemical vapor deposition (CVD) to provide iridium-containing films.

Some embodiments of the disclosure advantageously provide low temperature methods to deposit iridium-containing films. Some embodiments of the disclosure advantageously minimize damage to other materials by fluorine ions and their byproducts.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a film of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas sequentially.

One or more embodiments of the disclosure are directed to a method of depositing an iridium-containing film. In some embodiments, the deposition of the iridium-containing film is performed through an ALD process. In some embodiments, the deposition of the iridium-containing film is performed through a CVD process. In some embodiments, plasma treatments of a reactant or as a post-treatment after the iridium-containing film is deposited may also be used.

In some embodiments, the first reactive gas comprises an iridium precursor. In some embodiments, the iridium precursor comprises iridium hexafluoride.

In some embodiments, the second reactive gas comprises a reactant. In some embodiments, the reactant comprises hydrogen gas. In some embodiments, the reactant comprises hydrogen plasma. In some embodiments, the reactant comprises hydrogen radicals.

In some embodiments, the reactant comprises one or more silicon precursor. Silicon precursors, include but are not limited to, silane ($SiH_4$), polysilanes ($Si_nH_{2n+2}$), halosilanes ($SiX_aH_{4-a}$), and halopolysilanes ($Si_nX_aH_{2n+2-a}$). In some embodiments, the one or more silicon precursor contains no halogen atoms. In some embodiments, the silicon precursor consists essentially of tetrasilane. As used in this manner, the term "consists essentially of" means that the silicon precursor is greater than or equal to about 95%, 98% or 99% of the stated species, on a molar basis.

In some embodiments, the substrate is exposed to the first reactive gas comprising an iridium precursor and the second reactive gas comprising a reactant sequentially. In some embodiments, the substrate is exposed to the first reactive gas and the second reactive gas simultaneously.

The methods of some embodiments may react precursors in an ALD or CVD process to form thin films. Suitable reactants include, but are not limited to, hydrogen and other co-reactants to make metal films. Suitable reactants also include, but are not limited to, silicon precursors and other silicon based co-reactants to make $M_xSi_y$ (metal silicide) films. Plasma treatments of a reactant may also be used.

The FIGURE depicts a method for forming an iridium-containing film on a substrate in accordance with one or more embodiment of the disclosure. The method 100 generally begins at 102, where a substrate, having a surface upon which an iridium-containing film is to be formed is provided and placed into a processing chamber. As used herein, a "substrate surface" refers to any substrate surface upon which a film may be formed. The substrate surface may have one or more features formed therein, one or more layers formed thereon, and combinations thereof. The substrate (or substrate surface) may be pretreated prior to the deposition of the iridium-containing film, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the iridium-containing film may be at least partially formed thereon. For example, in some embodiments, a layer comprising a metal, a nitride, an oxide, or the like, or combinations thereof may be disposed on the substrate and may have the iridium containing film formed upon such layer or layers.

In some embodiments, the substrate may be exposed to an optional soak process 103 prior to beginning the deposition process to form an iridium-containing film on the substrate (as discussed below at 104), as shown in phantom at 103. In one or more embodiments, the method of depositing the iridium-containing film on the substrate 104 does not include a soaking process.

At 104, an iridium-containing film is formed on the substrate. In some embodiments, the iridium-containing film may be formed via a cyclical deposition process, such as atomic layer deposition (ALD), or the like. In some embodiments, the forming of an iridium-containing film via a cyclical deposition process may generally comprise exposing the substrate to two or more process gases sequentially. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined film thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber, the capabilities of a vacuum system coupled thereto or the film being formed. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of film being formed and the geometry of the device being formed. A dose time should be long enough to provide a volume of compound sufficient to adsorb/chemisorb onto substantially the entire surface of the substrate and form a layer of a process gas component thereon.

The process of forming the iridium-containing film at 104 may begin by exposing the substrate to a first reactive gas. In some embodiments, the first reactive gas comprises an iridium precursor (also referred to as an iridium-containing gas, and the like) and is exposed to the substrate for a first period of time, as shown at 106.

The iridium-containing gas may be provided in one or more pulses or continuously. The flow rate of the iridium-containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The iridium-containing gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the iridium-containing gas may be any suitable amount of time necessary to allow the iridium precursor to form an adequate nucleation layer atop the substrate surfaces. For example, the iridium-containing gas may be flowed into the process chamber for a period of about 0.1 seconds to about 90 seconds. In some time-domain ALD processes, the iridium-containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the iridium-containing gas. The inert gas may be mixed with the iridium-containing gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the iridium-containing gas is mixed with argon prior to flowing into the process chamber.

Next, at 108, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas at 106. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of about 0 to about 10000 sccm to purge the process chamber.

In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess iridium-containing gas from the process chamber, preventing a reaction between the iridium precursor and a subsequent reactive gas.

Next, at 110, the substrate is exposed to a second process gas for a second period of time. The second process gas reacts with the iridium-containing compound on the substrate surface to create a deposited film. The second process gas can impact the resulting iridium film. For example, when the second process gas is $H_2$, an iridium film is deposited, but when the second reactive gas is a silicon precursor, an iridium silicide film may be deposited.

The reactant may be supplied to the substrate surface at a flow rate greater than the iridium precursor. In one or more embodiments, the flow rate of the reactant is greater than about 1 time that of the iridium precursor, or about 100 times that of the iridium precursor, or in the range of about 3000 to 5000 times that of the iridium precursor. The reactant can be supplied for a time in the range of about 1 sec to about 30 sec, or in the range of about 5 sec to about 20 sec, or in the range of about 10 sec to about 15 sec. The reactant can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 150° C., or at a temperature about the same as that of the substrate during the cobalt precursor deposition.

In some embodiments, the second reactive gas comprises $H_2$, or a plasma thereof. In some embodiments, the second reactive gas comprises one or more silicon precursors or plasmas thereof.

Plasmas used in some embodiments can be a conductively-coupled plasma (CCP) or inductively coupled plasma (ICP) and can be a direct plasma or a remote plasma. In some embodiments, the plasma has a power in the range of about 0 W to about 2000 W. In some embodiments, the minimum plasma power is greater than 0 W, 10 W, 50 W or 100 W.

Next, at 112, the process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the generic embodiment of the processing method shown in the FIGURE includes only two pulses of reactive gases, it will be understood that this is merely exemplary and that additional pulses of reactive gases may be used. For example, a nitride film of some embodiments can be grown by a first pulse containing a precursor gas like iridium pentachloride, a second pulse with a reducing agent followed by purging and a third pulse for nitridation. The pulses can be repeated in their entirety or in part. For example all three pulses could be repeated or only two can be repeated. This can be varied for each cycle.

Next, at 114, it is determined whether the iridium-containing film has achieved a predetermined thickness. If the predetermined thickness has not been achieved, the method 100 returns to 104 to continue forming the iridium-containing film until the predetermined thickness is reached. Once the predetermined thickness has been reached, the method 100 can either end or proceed to 116 for optional further processing.

Upon completion of deposition of the iridium-containing film to a desired thickness, the method 100 generally ends and the substrate can proceed for any further processing. For example, in some embodiments, a CVD process may be performed to bulk deposit an iridium-containing film to a target thickness. For example in some embodiments, the iridium-containing film may be deposited via ALD or CVD reaction of the iridium precursor and hydrogen radicals to form a total film thickness of about 10 to about 10,000 Å, or in some embodiments, about 10 to about 1000 Å, or in some embodiments, about 500 to about 5,000 Å.

While not illustrated within the FIGURE, in some embodiments, the iridium-containing film is deposited by a CVD process. In some embodiments, a thermal CVD process is used. In some embodiments, a plasma enhanced CVD process is used.

During a CVD process, the substrate is positioned on a pedestal which is configured to heat the substrate to a suitable processing temperature.

Next, an iridium precursor is flowed into the processing chamber. The iridium precursor can be a solid or liquid contained in an ampoule. A carrier gas can be flowed through the ampoule containing the iridium precursor to carry vaporized precursor molecules from the ampoule headspace to the processing chamber. The ampoule can be heated to increase the vapor pressure of the iridium precursor so that more of the precursor can be flowed to the processing chamber in a given time period. In some embodiments, the carrier gas comprises one or more of argon, helium, nitrogen, hydrogen, or other inert gases. The carrier gas comprising the gaseous cobalt precursor is flowed into the processing chamber.

Next, a reactant is flowed into the processing chamber and allowed to mix with the cobalt precursor. The iridium precursor and the reactant can be mixed prior to flowing into the processing chamber or can remain separate until both gases enter the processing chamber. Regardless, the substrate is exposed to the iridium precursor and the reactant simultaneously.

The iridium precursor and reactant can be flowed into the processing chamber with the same start and stop times, or one can be pulsed into a flow of the other. For example, in some embodiments, the reactant is flowed into the processing chamber and the carrier gas comprising the iridium precursor is pulsed into the processing chamber or into the flow of reactant. The pulse length and number of pulses can be varied.

Next, the deposition chamber is purged to remove any excess carrier gas, unreacted iridium precursor or reactant, reaction byproducts and reaction products. Purging the deposition chamber stops the formation of the iridium-containing film.

At this point it can be determined whether the iridium-containing film has achieved a predetermined thickness. If the predetermined thickness has not been achieved, the CVD process is repeated to continue forming the iridium-containing film until the predetermined thickness is reached.

Regardless of the specific method, the temperature of the substrate during deposition can be controlled, for example, by setting the temperature of the substrate support or susceptor. In some embodiments the substrate is held at a temperature in the range of about −25° C. to about 500° C., or in the range of about −10° C. to about 350° C., or in the range of about 0° C. to about 250° C. In some embodiments, the substrate is held at a temperature in the range of about −25° C. to about 250° C., or in the range of about −25° C. to about 300° C., or in the range of about 150° C. to about 300° C.

In one or more embodiments, the substrate is maintained at a temperature less than about 500° C., or less than about 400° C., or less than about 350° C., or less than about 300° C., or less than about 250° C., or less than about 250° C. In one or more embodiments, the substrate is maintained at a temperature more than about −25° C., or more than about 0° C., or more than about 25° C., or more than about 50° C., or more than about 100° C., or more than about 150° C., or more than about 200° C., or more than about 250° C.

In addition, additional process parameters may be regulated while exposing the substrate to the iridium-containing process gas and the reactant. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

In some embodiments, the second reactive gas comprises hydrogen and the resulting film formed is an iridium film. The hydrogen gas may be supplied to the substrate surface at a flow rate greater than the iridium-containing gas concentration. In one or more embodiments, the flow rate of $H_2$ is greater than about 1 time that of the iridium-containing gas, or about 100 times that of the iridium-containing gas, or in the range of about 3000 to 5000 times that of the iridium-containing gas. The hydrogen gas can be supplied, in time-domain ALD, for a time in the range of about 1 sec to about 30 sec, or in the range of about 5 sec to about 20 sec, or in the range of about 10 sec to about 15 sec. The hydrogen gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature about the same as that of the substrate while exposing the substrate to the iridium-containing process gas.

In some embodiments, the second reactive gas comprises hydrogen radicals. The hydrogen radicals can be generated by any suitable means including exposure of hydrogen gas to a "hot-wire". As used in this disclosure, the term "hot-wire" means any element that can be heated to a temperature sufficient to generate radicals in a gas flowing about the element. This is also referred to as a heating element.

The second reactive gas (e.g., hydrogen), while passing the hot wire, or heating element, becomes radicalized. For example, $H_2$ passing a hot ruthenium wire can result in the generation of H*. These hydrogen radicals may be more reactive than ground state hydrogen atoms.

Suitable co-reactants include, but are not limited to, hydrogen, silicon precursors and plasmas thereof. In some embodiments, the co-reactant comprises $H_2$ or a plasma thereof, argon plasma, nitrogen plasma, helium plasma, $Ar/N_2$ plasma, Ar/He plasma, $N_2$/He plasma and/or $Ar/N_2$/He plasma to deposit a metal film (e.g., Ir).

In some embodiments, the iridium-containing film comprises greater than or equal to about 95 atomic percent iridium, or greater than or equal to about 97 atomic percent iridium, or greater than or equal to about 98 atomic percent iridium, or greater than or equal to about 99 atomic percent iridium, or greater than or equal to about 99.5 atomic percent iridium, or greater than or equal to about 99.8 atomic percent iridium.

In some embodiments, the iridium-containing film contains essentially no fluorine atoms. As used in this manner, the term "contains essentially no fluorine atoms" means the iridium-containing film comprises less than or equal to about 2%, 1% or 0.5% of fluorine atoms on an atomic basis.

In some embodiments, the substrate surface comprises a first material and a second material. In some embodiments, the first material and the second material are the same. In some embodiments, the first material and the second material are different.

In some embodiments, the first material comprises silicon metal. In some embodiments, the first material consists essentially of silicon. In some embodiments, the second material comprises silicon oxide, silicon nitride or $Al_2O_3$.

In some embodiments, an iridium-containing film is deposited selectively on the first material over the second material. As used in this specification and the appended claims, the phrase "deposited selectively", or similar terms, mean that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface.

In some embodiments, the silicon content of the iridium-containing film can be adjusted through the control of deposition parameters. In some embodiments, one or more of the flow rate of the silicon precursor, the pulse time of the silicon precursor, or the substrate surface temperature during deposition is controlled to form an iridium-containing film with a predetermined silicon content.

In some embodiments, the iridium-containing film contains greater than 0 percent silicon, or greater than 10 percent silicon, or greater than 20 percent silicon, or greater than 25 percent silicon, or greater than 30 percent silicon, or greater than 40 percent silicon, or greater than 50 percent silicon, on an atomic basis. In some embodiments, the iridium-containing film contains less than 50 percent silicon, or less than 40 percent silicon, or less than 30 percent silicon, or less than 25 percent silicon, or less than 20 percent silicon, or less than 10 percent silicon, or less than 5 percent silicon, on an atomic basis. In some embodiments, the iridium-containing film contains in the range of greater than 0 to about 50 percent silicon on an atomic basis.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing an iridium silicide film, the method comprising exposing a substrate surface maintained at a temperature in the range of about −25° C. to less than 300° C. to iridium hexafluoride and a silicon precursor, wherein the entire substrate surface is maintained at the temperature in the range of about −25° C. to less than 300° C. during the method, wherein the substrate surface comprises a first material consisting essentially of silicon and a second material comprising silicon oxide, silicon nitride or Al$_2$O$_3$ and the iridium silicide film is deposited selectively on the first material over the second material at a rate 15 times greater on the first material over the second material.

2. The method of claim 1, wherein the substrate surface is exposed to the iridium hexafluoride and the reactant simultaneously.

3. The method of claim 1, wherein the substrate surface is exposed to the iridium hexafluoride and the reactant sequentially.

4. The method of claim 1, wherein the iridium silicide film is greater than or equal to about 99.5% iridium atoms.

5. The method of claim 1, wherein the silicon precursor is selected from silane, polysilanes, halosilanes, and halopolysilanes.

6. The method of claim 5, wherein the silicon precursor consists essentially of tetrasilane.

7. The method of claim 5, wherein the silicon precursor contains no halogen.

8. The method of claim 1, wherein the iridium silicide film contains essentially no fluorine atoms.

9. The method of claim 1, wherein the entire substrate surface is maintained at the temperature in the range of about −25° C. to less than 250° C. during the method.

10. A method of depositing an iridium silicide film, the method comprising:
sequentially exposing a substrate surface maintained at a temperature in the range of about −25° C. to less than 300° C. to iridium hexafluoride and a silicon precursor, wherein the entire substrate surface is maintained at the temperature in the range of about −25° C. to less than 300° C. during the method; and
controlling one or more of a flow rate of the silicon precursor, a pulse time of the silicon precursor, or the temperature of the substrate surface to form an iridium silicide film with essentially no fluorine atoms and a predetermined silicon content, wherein the substrate surface comprises a first material consisting essentially of silicon and a second material comprising silicon oxide, silicon nitride or Al$_2$O$_3$ and the iridium silicide film is deposited selectively on the first material over the second material at a rate 15 times greater on the first material over the second material.

11. The method of claim 10, wherein the silicon precursor is selected from silane, polysilanes, halosilanes, and halopolysilanes.

12. The method of claim 11, wherein the silicon precursor consists essentially of tetrasilane.

13. The method of claim 10, wherein the entire substrate surface is maintained at the temperature in the range of about 150° C. to less than 300° C. during the method.

14. The method of claim 10, wherein the iridium silicide film contains essentially no fluorine atoms.

* * * * *